United States Patent
Shiraishi

(10) Patent No.: US 8,194,322 B2
(45) Date of Patent: Jun. 5, 2012

(54) MULTILAYER-FILM REFLECTIVE MIRROR, EXPOSURE APPARATUS, DEVICE MANUFACTURING METHOD, AND MANUFACTURING METHOD OF MULTILAYER-FILM REFLECTIVE MIRROR

(75) Inventor: Masayuki Shiraishi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 461 days.

(21) Appl. No.: 12/074,903

(22) Filed: Mar. 7, 2008

(65) Prior Publication Data
US 2008/0259439 A1   Oct. 23, 2008

Related U.S. Application Data

(60) Provisional application No. 60/907,935, filed on Apr. 23, 2007.

(51) Int. Cl.
*G02B 1/10* (2006.01)
(52) U.S. Cl. .............................. 359/586; 359/577; 430/5
(58) Field of Classification Search .......... 359/350–361, 359/577–590
See application file for complete search history.

(56) References Cited

U.S. PATENT DOCUMENTS

| | | | |
|---|---|---|---|
| 6,208,407 B1 | 3/2001 | Loopstra | |
| 6,262,796 B1 | 7/2001 | Loopstra et al. | |
| 6,319,635 B1 * | 11/2001 | Mirkarimi et al. | 430/5 |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,645,679 B1 * | 11/2003 | La Fontaine et al. | 430/5 |
| 6,897,963 B1 | 5/2005 | Taniguchi et al. | |
| 7,049,033 B2 * | 5/2006 | Stearns et al. | 430/5 |
| 2004/0062999 A1 * | 4/2004 | Stearns et al. | 430/5 |
| 2005/0157384 A1 | 7/2005 | Shiraishi et al. | |
| 2006/0160034 A1 * | 7/2006 | Wurm et al. | 430/330 |
| 2007/0082272 A1 | 4/2007 | Mann et al. | |

FOREIGN PATENT DOCUMENTS

| | | |
|---|---|---|
| JP | 03 041399 | 2/1991 |
| JP | 03 072298 | 3/1991 |
| WO | 02/054151 | 7/2002 |
| WO | 2005/036266 | 4/2005 |

OTHER PUBLICATIONS

International Search Report from corresponding International Application No. PCT/JP2008/057789, dated Jul. 23, 2008.
Written Opinion issued in corresponding Japan Patent Application No. PCT/JP2008/057789.
Written Opinion issued in corresponding International Patent Application No. PCT/JP2008/057789.

* cited by examiner

*Primary Examiner* — Thong Nguyen
(74) *Attorney, Agent, or Firm* — Klarquist Sparkman, LLP

(57) ABSTRACT

Multilayer-film reflective mirrors are disclosed. An exemplary such mirror has a base and a multilayer film formed on the base. The multilayer film includes multiple layer pairs. Each layer pair includes a respective first layer and a respective second layer, wherein the first and second layers are laminated together in an alternating manner. The multilayer film has first and second regions that reflect extreme ultraviolet light. A first group of layers is disposed in the first and second regions and has a first periodic length. A second group disposed in the first region has a second periodic length different from the first periodic length, and a third group disposed in the second region has a substantially same periodic length as the first periodic length.

19 Claims, 11 Drawing Sheets (A)

(B)

MULTILAYER-FILM REFLECTIVE MIRROR, EXPOSURE APPARATUS, DEVICE MANUFACTURING METHOD, AND MANUFACTURING METHOD OF MULTILAYER-FILM REFLECTIVE MIRROR

CROSS REFERENCE TO RELATED APPLICATION

This application is a non-provisional application claiming priority to and the benefit of U.S. provisional application No. 60/907,935, filed Apr. 23, 2007, the entire contents of which are incorporated herein by reference.

BACKGROUND

1. Field of the Invention

The present invention relates to a multilayer-film reflective mirror, an exposure apparatus, a device manufacturing method, and a manufacturing method of a multilayer-film reflective mirror.

2. Description of Related Art

In an exposure apparatus for use in a photolithography process, there is proposed an EUV exposure apparatus as disclosed for example in U.S. Patent Application, Publication No. 2005/0157384, in which Extreme Ultra-Violet (EUV) light is used as exposure light. In an optical system of an EUV exposure apparatus, a multilayer-film reflective mirror is used.

When a surface of a multilayer film of a multilayer-film reflective mirror is machined to remove a part of a layer of the surface in order to adjust an optical characteristic of the multilayer-film reflective mirror, there is a possibility of increasing the machining workload. Furthermore, when a surface of a multilayer film is machined to remove a part of a layer of the surface thereof, there is a possibility that a desired optical characteristic is not obtained due to a stepwise change in phase change amount between a machined region and an unmachined region, or the like.

A purpose of some aspects of the present invention is to provide a multilayer-film reflective mirror which can offer a desired optical characteristic. Another purpose is to provide a manufacturing method of a multilayer-film reflective mirror which can suppress increase in machining workload and offer a desired optical characteristic. Still another purpose is to provide an exposure apparatus capable of favorably exposing a substrate by use of a multilayer-film reflective mirror which offers a desired optical characteristic, and to provide a device manufacturing method using the exposure apparatus.

SUMMARY

According to a first aspect exemplifying the present invention, there is provided a multilayer-film reflective mirror, comprising: a base; and a multilayer film formed on the base, in which the multilayer film comprises: multiple layer pairs, each comprising a respective first layer and a respective second layer, the first and second layers laminated together in an alternating manner; first and second regions being capable of reflecting extreme ultraviolet light; a first group disposed in the first and second regions and having a first periodic length; a second group disposed in the first region and having a second periodic length different from the first periodic length; and a third group disposed in the second region and having a substantially same periodic length as the first periodic length.

According to the first aspect exemplifying the present invention, a multilayer film has a first region comprising a first group with a first periodic length and a second group with a second periodic length different from the first periodic length, and hence a desired optical characteristic can be obtained.

According to a second aspect exemplifying the present invention, there is provided an exposure apparatus that exposes a substrate with exposure light, comprising the multilayer-film reflective mirror of the above aspect.

According to the second aspect exemplifying the present invention, a multilayer-film reflective mirror which can offer a desired optical characteristic is provided. Therefore, a substrate can be favorably exposed.

According to a third aspect exemplifying the present invention, there is provided a device manufacturing method, comprising: exposing a substrate by use of the exposure apparatus of one of the above aspect; and developing the exposed substrate.

According to the third aspect exemplifying the present invention, a device can be manufactured by use of the exposure apparatus that can favorably expose a substrate.

According to a fourth aspect exemplifying the present invention, there is provided a manufacturing method of a multilayer-film reflective mirror, comprising: forming a multilayer film by alternately laminating first layers and second layers on a base, the multilayer film being capable of reflecting extreme ultraviolet light; and heating at least a part of the multilayer film to form a region in the multilayer film, the region comprising a first group with a first periodic length and a second group with a second periodic length different from the first periodic length.

According to the fourth aspect exemplifying the present invention, by heating at least a part of a multilayer film, a region comprising a first group with a first periodic length and a second group with a second periodic length different from the first periodic length is formed. Therefore, a multilayer-film reflective mirror which can offer a desired optical characteristic can be manufactured while suppressing increases in the machining workload.

According to the some aspects of the present invention, a multilayer-film reflective mirror can offer a desired optical characteristic. An exposure apparatus provided with the multilayer-film reflective mirror can favorably expose a substrate. Furthermore, a device with a desired performance can be manufactured by use of the exposure apparatus.

DESCRIPTION OF EMBODIMENTS

Hereunder is an exemplary description of embodiments of the present invention with reference to the drawings. However, the present invention is not limited to this description. In the following description, an XYZ rectangular coordinate system is established, and the positional relationship of respective members is described with reference to this XYZ rectangular coordinate system. A predetermined direction within a horizontal plane is made the X axis direction, a direction orthogonal to the X axis direction within the horizontal plane is made the Y axis direction, and a direction orthogonal to both the X axis direction and the Y axis direction (that is, a perpendicular direction) is made the Z axis direction. Furthermore, rotation (tilt) directions about the X axis, the Y axis and the Z axis, are made in the θX, the θY, and the θZ directions respectively.

First Embodiment

Figure 1:
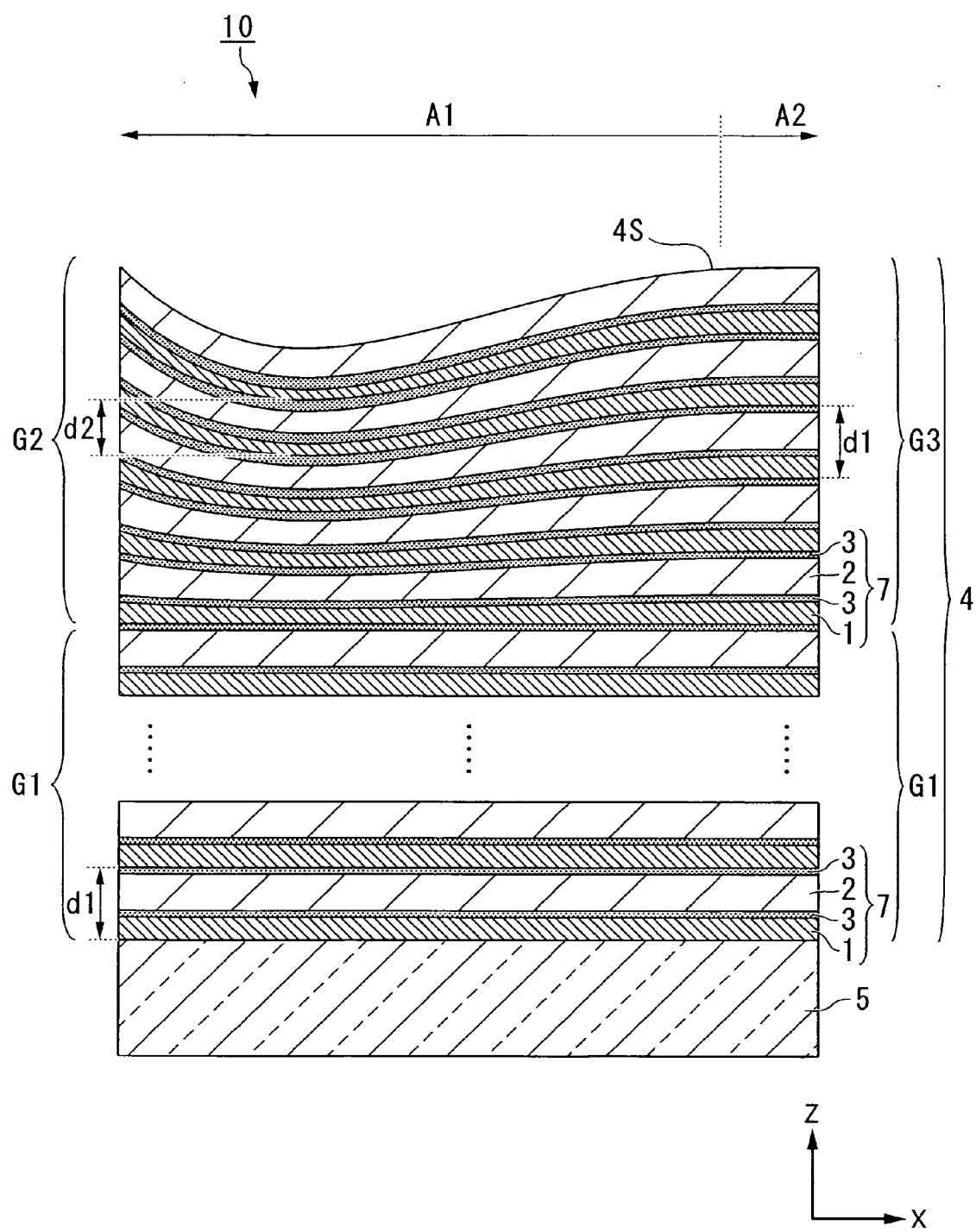
FIG. 1 is a schematic diagram showing one example of a multilayer-film reflective mirror according to a first embodiment.

A first embodiment will be described. FIG. 1 is a schematic diagram showing one example of a multilayer-film reflective mirror 10 according to the first embodiment. In FIG. 1, the multilayer-film reflective mirror 10 comprises: a base 5; and a multilayer film 4 that comprises first layers 1 and second layers 2 alternately laminated on the base 5 and is capable of reflecting extreme ultraviolet light. The multilayer-film reflective mirror 10 further comprises, between the first layer 1 and the second layer 2, a diffusion layer 3 that is formed by diffusion of a material forming the first layer 1 and a material forming the second layer 2.

Extreme ultraviolet light is an electromagnetic wave in a soft X-ray region (extreme ultraviolet region) at a wavelength of for example approximately 5 to 50 nm, which is reflected by the multilayer film 4. In the following description, extreme ultraviolet light is appropriately referred to as EUV light.

The base 5 is formed of for example an ultra low expansion glass. As the base 5, for example ULE manufactured by Corning Incorporated, Zerodur (registered trademark) manufactured by SCHOTT AG, or the like can be used.

The first layer 1, the second layer 2, and the diffusion layer 3 are periodically formed in the Z axis direction which is substantially parallel to a thickness direction of the multilayer film 4. That is, in the present embodiment, the multilayer film 4 is a lamination of a plurality of aggregations of a single first layer 1, a single second layer 2, and two diffusion layers 3. The thicknesses of the respective layers of the multilayer film 4 are set based on the theory of optical interference so that the reflecting waves reflected respectively by each of the interfaces with the respective layers coincide with one another in phase. The multilayer film 4 is capable of reflecting the EUV light with a high reflectance of for example 60% or greater.

The multilayer film 4 has a predetermined periodic length. In the present embodiment, a periodic length is a thickness of an aggregation which comprises a single first layer 1, a single second layer 2, and two diffusion layers 3. That is, the periodic length is a sum of: a thickness of a first layer 1; a thickness of a diffusion layer 3 formed on the first layer 1; a thickness of a second layer 2; and a thickness of a diffusion layer 3 formed on the second layer 2. In other words, the periodic length is a distance (thickness) in the Z axis direction between a bottom surface of a predetermined first layer 1 and a bottom surface of a first layer 1 next closest to a surface 4S of a multilayer film 4 after the predetermined first layer 1.

In the following description, an aggregation that comprises a single first layer 1, a single second layer 2, and two diffusion layers 3 is appropriately referred to as a layer pair 7. In the present embodiment, in a single layer pair 7, a first layer 1 is arranged on the base 5 side (on the −Z side, in the figure) with respect to a second layer 2. Note that the layer pair 7 which forms the surface 4S of the multilayer film 4 has only a single diffusion layer 3. The surface 4S of the multilayer film 4 is formed of a second layer 2.

In the present embodiment, a surface of the base 5 is substantially parallel to the XY plane. A plurality of the layer pairs 7 are sequentially laminated thereon in the +Z direction.

In the case where the diffusion layers 3 are not present, a periodic length is the sum of the thickness of the first layer 1 and the thickness of the second layer 2, and hence the layer pair 7 is an aggregation made of a single first layer 1 and a single second layer 2.

The multilayer film 4 has a first region A1 that comprises a first layer group G1 with a first periodic length d1 and a second layer group G2 with a second periodic length d2 different from the first periodic length d1. Furthermore, the multilayer film 4 has a second region A2 that comprises a first layer group G1 at the first periodic length d1 and a third layer group G3 at the same periodic length as the first periodic length d1.

In the present embodiment, the first region A1 is a part of the multilayer film 4 within the XY plane parallel to the surface 4S of the multilayer film 4. It comprises the first layer group G1 and the second layer group G2. The second region A2 is a part of the multilayer film 4 different from the first region A1 within the XY plane. It comprises the first layer group G1 and the third layer group G3.

The first layer group G1 is a part of the multilayer film 4 in the thickness direction of the multilayer film 4 (the Z axis direction). It is an aggregation of a plurality of the layer pairs 7 (layers) that form the multilayer film 4. The second layer group G2 is a part of the multilayer film 4 different from the first layer group G1 in the Z axis direction. It is an aggregation of a plurality of the layer pairs 7 (layers) that form the multilayer film 4. The third layer group G3 is a part of the multilayer film 4 different from the first layer group G1 in the Z axis direction. It is an aggregation of a plurality of the layer pairs 7 (layers) that form the multilayer film 4.

In the present embodiment, the first layer group G1 is arranged on the base 5 over the first region A1 and the second region A2. The number of layer pairs 7 (layers) of the first layer group G1 in the first region A1 is equal to the number of layer pairs 7 (layers) of the first layer group G1 in the second region A2.

The second layer group G2 and the third layer group G3 is arranged on the +Z side of the first layer group G1 (the surface 4S side of the multilayer film 4). The second layer group G2 is arranged in the first region A1 on the +Z side of the first layer group G1. The third layer group G3 is arranged in the second region A2 on the +Z side of the first layer group G1.

In the first region A1, the first layers 1 and the second layers 2 of the first layer group G1 and the first layers 1 and second layers 2 of the second layer group G2 are successive with respect to the Z axis direction. That is, between the first layer group G1 and the second layer group G2, no other layer is present. The first layers 1 and the second layers 2 of the first layer group G1, and the first layers 1 and the second layers 2 of the second layer group G2 are arranged so as to be periodically successive along to the Z axis direction. Similarly, in the second region A2, the first layers 1 and the second layers 2 of the first layer group G1 and the first layers 1 and the second layers 2 of the third layer group G3 are successive in the Z axis direction.

The first layers 1 and the second layers 2 of the second layer group G2 are respectively continuous with the first layers 1 and the second layers 2 of the third layer group G3 between the first region A1 and the second region A2. The number of layer pairs 7 (layers) of the second layer group G2 in the first region A1 is equal to the number of layer pairs 7 (layers) of the third layer group G3 in the second region A2. That is, between the first layers 1 and the second layers 2 of the second layer group G2, and the first layers 1 and the second layers 2 of the third layer group G3, no steps or the like are present, and hence the layers are respectively continuous between the first region A1 and the second region A2.

In the present embodiment, the diffusion layer 3 of the second layer group G2 has a thickness larger than that of the diffusion layer 3 of the first layer group G1 in the first region A1. Furthermore, in the present embodiment, the second periodic length d2 of the second layer group G2 is shorter than the first periodic length d1 of the first layer group G1 in the first region A1. Furthermore, the second periodic length d2 of the second layer group G2 is shorter than the periodic length (the first periodic length) d1 of the third layer group G3.

On the base 5, there are laminated for example tens to hundreds of layer pairs 7. As one example, in the present embodiment, fifty layer pairs 7 are laminated on the base 5. The second layer group G2 is a portion of one to ten layer pairs from the surface in the first region A1 of the multilayer film 4. As one example, in the present embodiment, the second layer group G2 is a portion of five layer pairs from the surface in the first region A1 of the multilayer film 4. In other words, as one example, the second layer group G2 corresponds with five layer pairs adjacent to the surface of the multilayer film 4 within the first region A1.

The first layer 1 is formed of a material with a large difference between the refractive index for EUV light and the refractive index of a vacuum. The second layer 2 is formed of a material with a small difference between the refractive index for EUV light and the refractive index of a vacuum. That is, the difference between the refractive index for the EUV light and the refractive index of a vacuum in the first layer 1 is larger than that in the second layer 2. In the present embodiment, the first layer (heavy atom layer) 1 is formed of molybdenum (Mo), and the second layer (light atom layer) 2 is formed of silicon (Si). That is, the multilayer film 4 in the present embodiment is a Mo/Si multilayer film in which molybdenum layers (Mo layers) and silicon layers (Si layers) are alternately laminated. The surface 4S of the multilayer film 4 is formed of a silicon layer which is the second layer 2.

The refractive index of a vacuum n=1. Furthermore, with respect to the EUV light at a wavelength of for example 13.5 nm, the refractive index of molybdenum $n_{mo}$=0.92, and the refractive index of silicon $n_{si}$=0.998. In this manner, the second layer 2 is formed of a material whose refractive index with respect to EUV light is substantially equal to the refractive index of a vacuum.

Figure 2:
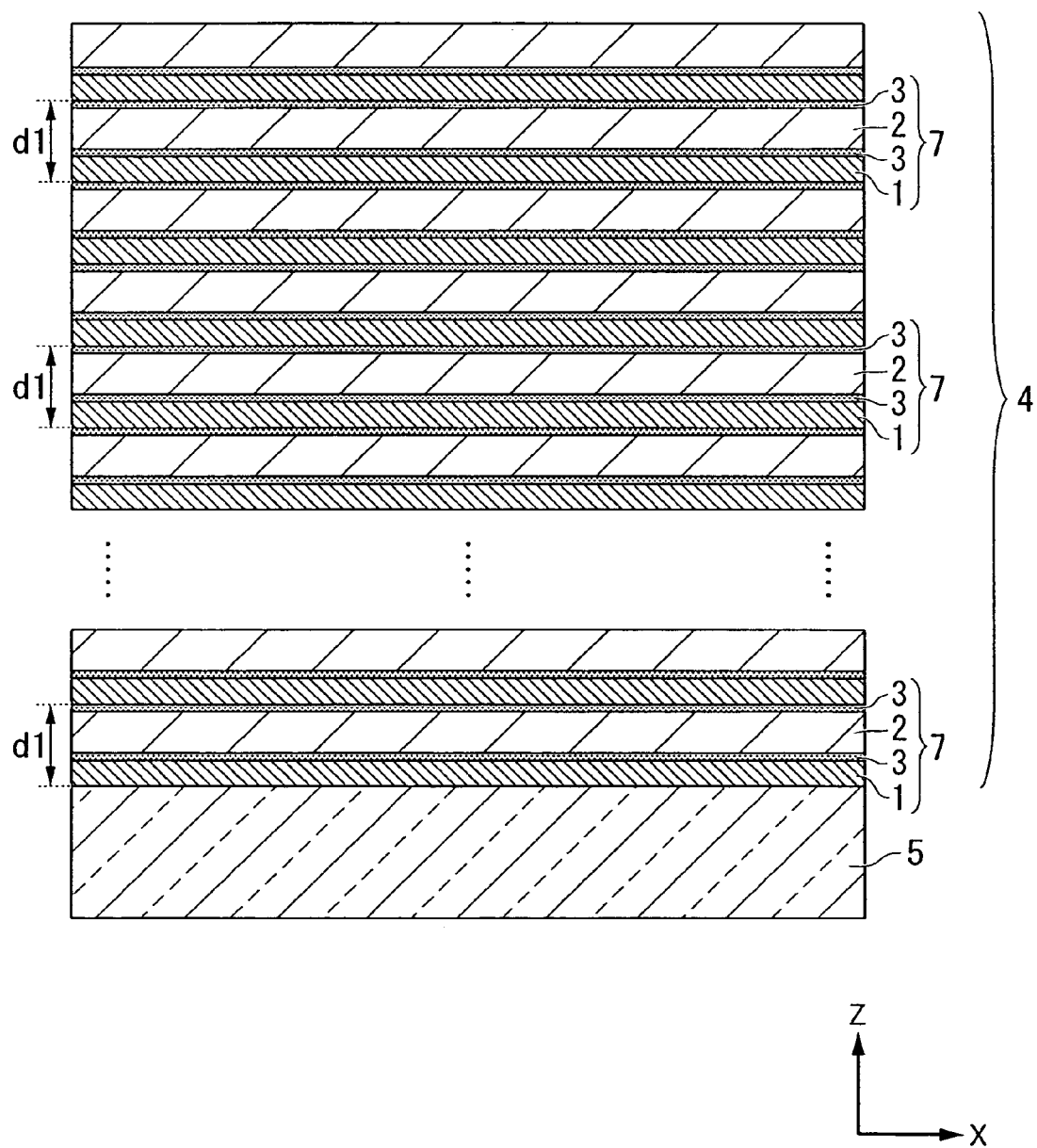
FIG. 2 is a schematic elevational section of a portion of a multilayer-film reflective mirror before commencing the selective heating method according to the first embodiment.

Next is a description of a method of manufacturing the above multilayer-film reflective mirror 10. First, as shown in FIG. 2, first layers 1 and second layers 2 are alternately laminated on a base 5 to form a multilayer film 4 capable of reflecting EUV light. The first layers 1 and the second layers 2 are formed by, for example, the sputtering method. In the present embodiment, the first layers 1 and the second layers 2 are formed by the ion beam sputtering method. Furthermore, a magnetron sputtering apparatus, for example, can be used to form the first layers 1 and the second layers 2.

In the present embodiment, the sum of the design thickness (target value) of the first layer 1 and the design thickness (target value) of the second layer 2 (i.e., the design periodic length) is 6.95 nm. Furthermore, the design ratio (target ratio) of the thickness of the first layer 1 to the thickness of the second layer 2 (hereinafter, referred to as layer thickness ratio) is 2:3. That is, the design thickness of the first layer 1 is 2.78 nm, and the design thickness of the second layer 2 is 4.17 nm. Based on these design values, manufacturing conditions comprising the sputtering conditions when the first layers 1 and the second layers 2 are formed are established.

Lamination of the first layers 1 and the second layers 2, in actuality, diffuses the material forming the first layer 1 and the material forming the second layer 2. Thereby, as shown in FIG. 2, a diffusion layer 3 is formed between the first layer 1 and the second layer 2. As described above, in the present embodiment, the material forming the first layer 1 comprises molybdenum (Mo), and the material forming the second layer 2 comprises silicon (Si). The material forming the diffusion layer 3 comprises molybdenum silicide ($MoSi_x$). As a result, the multilayer film 4 that comprises the first layers 1, the second layers 2, and the diffusion layers 3 is formed on the base 5. Aggregations of the first layer 1, the second layer 2, and the diffusion layers 3 are formed on the base 5 with a first periodic length d1.

As one example, in the state of FIG. 2, the first layer 1 has a thickness of 2.3131 nm; the second layer 2 has a thickness of 2.6369 nm; the diffusion layer 3 has a thickness of 1.0000 nm; and the periodic length d1 (first periodic length) is 6.95 nm. Note that the numerical values above are results of a simulation experiment performed so as to maintain the ratio of number of atoms of molybdenum to silicon based on the layer thickness ratio by design value, with the molecular weights, densities, etc. of molybdenum and silicon as parameters. The simulation experiment was carried out for the case where diffusion layer 3 is formed of $MoSi_2$ by way of example.

Note that the thickness of the diffusion layer 3 can be adjusted by adjusting the manufacturing conditions comprising the sputtering conditions when the first layer 1 and the second layer 2 are formed.

Next, processing of heating at least a part of the multilayer film 4 is performed. By heating a part of the multilayer film 4, the periodic length of the heated part of the multilayer film 4 can be changed. To be more specific, by heating a part of the multilayer film 4, the period length of the heated part of the multilayer film 4 can be decreased in periodic length. As a result, a first region A1 that comprises a first layer group G1 with a first periodic length d1 and a second layer group G2 with a second periodic length d2 different from the first periodic length d1 is formed in the multilayer film 4.

Figure 3:
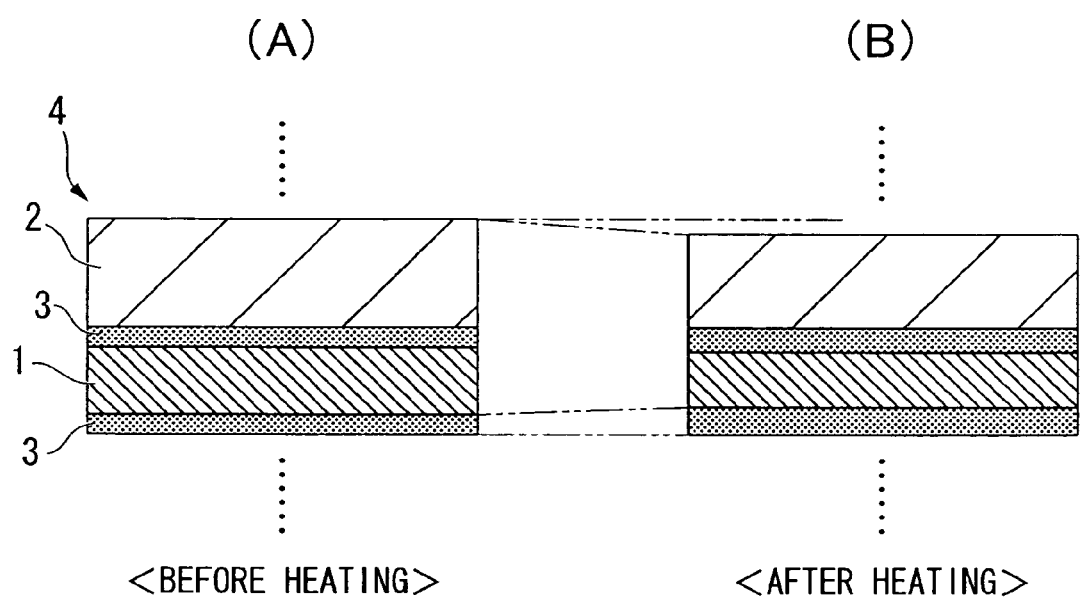
FIG. 3 is a schematic diagram showing a region of a layer pair before (A) and after (B) being heated, in the selective heating method according to the first embodiment.

Part (A) of FIG. 3 schematically shows a part of the multilayer film 4 before being heated. Part (B) of FIG. 3 schematically shows a part of the multilayer film 4 after being heated. As shown in FIG. 3, in the present embodiment, heating of the multilayer film 4 brings about a phenomenon in which the heated part of the multilayer film 4 shrinks.

That is, in the present embodiment, heating of the multilayer film 4 promotes formation of the diffusion layers 3, bringing about a phenomenon in which the thicknesses of the diffusion layers 3 are increased. When the formation of the diffusion layers 3 is promoted and the diffusion layers 3 are increased in thickness, the thickness(s) of the first layer(s) 1 and the thickness(es) of the second layer(s) 2 are decreased. When the thickness(es) of the first layer(s) 1 and the thickness(es) of the second layer(s) 2 are decreased in accordance with the increase of the thickness(es) of the diffusion layer(s) 3, the multilayer film 4 shrinks according to the respective densities of the first layer 1, the second layer 2, and the diffusion layers 3. That is, although heating does not change the sum total of the atoms of molybdenum and silicon, a single layer pair 7 is decreased in thickness with the progression of diffusion, according to the relationship in density among molybdenum, silicon, and molybdenum silicide. As a result, the periodic length is shortened.

Accordingly, in the present embodiment, by heating a part of the multilayer film 4, the heated part of the multilayer film 4 can be shrunk, to thereby shorten the periodic length.

In the present embodiment, the heating processing comprises processing of irradiating light onto the surface of the multilayer film 4. As shown in part (A) of FIG. 4, in the present embodiment, to heat at least a part of the multilayer film 4, laser light from a laser apparatus 50 is irradiated onto the surface 4S of the multilayer film 4. The laser apparatus 50 comprises: a laser light generator for generating laser light; and a collection optical system for collecting laser light emitted from the laser light generator. The laser light emitted from the laser apparatus 50 is irradiated onto a local region of a part of the surface 4S of the multilayer film 4. At least a part of the multilayer film 4 is heated by the laser light. As a result, a part of the multilayer film 4 shrinks, leading to a change in periodic length. In the present embodiment, the multilayer film 4 is heated so as to be at a temperature of 100° C. or higher.

Furthermore, by adjusting heating conditions, the periodic length can be adjusted. As described above, in the present embodiment, heating processing comprises the processing of irradiating light (laser beam) onto the surface 4S of the multilayer film 4, and heating conditions comprise light irradiation conditions. The heating conditions (light irradiation conditions) comprise at least one of for example light quantity (power), wavelength, and irradiation time of the laser light. By adjusting these heating conditions (light irradiation conditions), the periodic length can be adjusted. Furthermore, by adjusting the heating conditions, the number of layer pairs 7 that changes the periodic length can be adjusted. The number of layer pairs 7 comprises the number of layer pairs 7 from the surface of the multilayer film 4.

In the present embodiment, the heating conditions are adjusted so that by heating a part of the multilayer film 4 with a first periodic length d1, the first periodic length d1 of the heated part is decreased by a predetermined amount to be a second periodic length d2. In the present embodiment, the heating conditions (light irradiation conditions) are adjusted so that the first periodic length d1 is decreased by 1% to become equal to the second periodic length d2. Note that an amount of decrease in periodic length can be accurately measured by a method of small-angle X-ray scattering or the like.

Furthermore, in the present embodiment, the heating conditions (light irradiation conditions) are adjusted so that heating the multilayer film 4 makes the periodic length for a portion of five layer pairs from the surface in the first region A1 of the multilayer film 4 equal to the second periodic length d2. In the present embodiment, because laser light is irradiated onto the surface 4S of the multilayer film 4 from a position opposed to the surface 4S of the multilayer film 4, the periodic length for a portion of the predetermined number of layer pairs 7 from the surface in the first region A1 of the multilayer film 4 can be changed.

Figure 4:
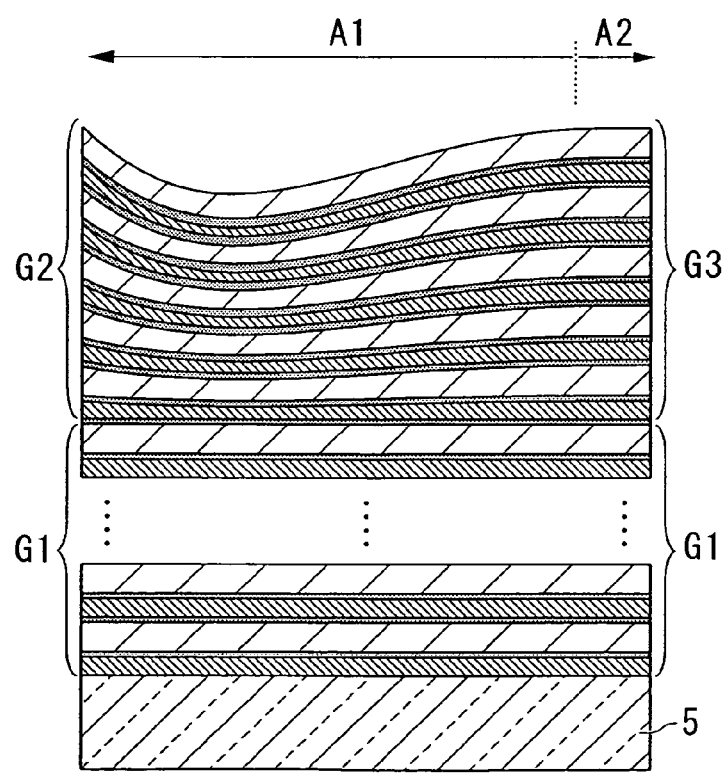
FIG. 4 is a schematic elevational section of a portion of a multilayer-film reflective mirror before (A) and after (B) heating using incident laser light, in the selective heating method according to the first embodiment.

As a result, in the multilayer film 4, there are formed a first region A1 that comprises a first layer group G1 with a first periodic length d1 and a second layer group G2 with a second periodic length d2, and a second region A2 that comprises a first layer group G1 at the first periodic length d1 and a third layer group G3 at the first periodic length d1, as shown in part (B) of FIG. 4.

In this manner, in the present embodiment, the second layer group G2 is formed by heating. In other words, in the present embodiment, the second layer group G2 is a processed region (heated region) which has been subjected to heat processing, and the first layer group G1 and the third layer group G3 are unprocessed regions which have not been subjected to heat processing. The first layers 1 and the second layers 2 of the second layer group G2 in the heat-processed portion are smoothly continuous with the first layers 1 and the second layers 2 of the first layer group G1 in the nonheat-processed portion.

As one example, in the present embodiment, in the first layer group G1 and the third layer group G3, the first layer 1 has a thickness of 2.3131 nm; the second layer 2 has a thickness of 2.6369 nm; and the diffusion layer 3 has a thickness of 1.0000 nm. In the second layer group G2, the first layer 1 has a thickness of 2.2437 nm; the second layer 2 has a thickness of 2.4585 nm; and the diffusion layer 3 has a thickness of 1.0891 nm. The first periodic length d1 (i.e., the periodic length of the first layer group G1 and the third layer group G3) is 6.95 nm, and the second periodic length d2 (i.e., the periodic length of the second layer group G2) is 6.8804 nm.

According to the present embodiment, a local region of the multilayer film 4 is heated to change the periodic length of the multilayer film 4 by a predetermined amount. Therefore, when EUV light is incident on the multilayer-film reflective mirror 10, a desired phase change can be obtained while maintaining a desired reflectance. Reflectance is the ratio of the light quantity of incident light when EUV light is incident on the surface 4S of the multilayer film 4 to the light quantity of reflected light reflected off the multilayer film 4. Phase change is the difference in phase between incident light when EUV light is incident on the surface 4S of the multilayer film 4 and reflected light reflected off the multilayer film 4.

When the multilayer film 4 is changed in periodic length, a peak wavelength of the multilayer-film reflective mirror 10 can be changed. A peak wavelength is a wavelength of an electromagnetic wave (light) which the multilayer-film reflective mirror 10 can reflect with the highest reflectance when the electromagnetic wave is incident on the multilayer-film reflective mirror 10. In the present embodiment, a peak wavelength comprises a wavelength of an electromagnetic wave, in the extreme ultraviolet region (wavelengths ranging approximately from 5 to 50 nm), which the multilayer-film reflective mirror 10 can reflect with the highest reflectance. The periodic length and peak wavelength of the multilayer film 4 have a corresponding relationship. The peak wavelength changes according to the periodic length of the multilayer film 4. In general, the shorter the periodic length is, the shorter the peak wavelength is.

In the case where the periodic length of the multilayer film 4 is changed to change the peak wavelength when an electromagnetic wave at a certain predetermined wavelength (hereinafter referred to as an operation wavelength) (for example, an electromagnetic wave at a wavelength of 13.5 nm) is incident on the multilayer-film reflective mirror 10, the amount of phase change with respect to the electromagnetic wave at the operation wavelength changes according to the amount of change of the peak wavelength. That is, by changing the peak wavelength, phase change with respect to the electromagnetic wave at the operation wavelength can be adjusted. By adjusting the phase change, a wavefront (wavefront aberration) can be changed. Therefore, the wavefront (wavefront aberration) can be favorably controlled.

That is, in the present embodiment, heating the multilayer film 4 adjusts the periodic length. The adjustment of the periodic length adjusts the peak wavelength. The adjustment of the peak wavelength controls the phase change with respect to the electromagnetic wave at the operation wavelength, and consequently the wavefront. As a result, the wavefront of the optical system comprising the multilayer-film reflective mirror 10 can be controlled, and hence phase control so as to reduce aberration can be performed.

When a peak wavelength is changed, there is a possibility that reflectance for the electromagnetic wave at an operation wavelength changes (decreases). In the present embodiment, the amount of change (decrease amount) of the periodic length is adjusted so that the amount of change (decrease amount) of the reflectance is within a tolerance level, and so that a desired phase change can be obtained. The periodic length can be adjusted by adjusting the heating conditions.

Figure 5A:
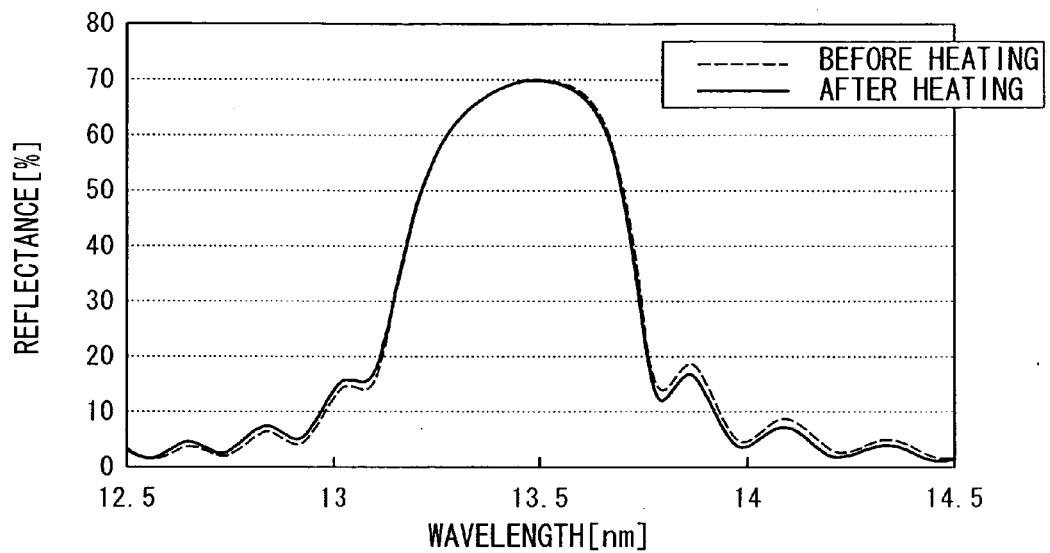
FIG. 5A shows relationships between heating processing and reflectance change with respect to a multilayer-film reflective mirror according to the first embodiment.
Figure 5B:
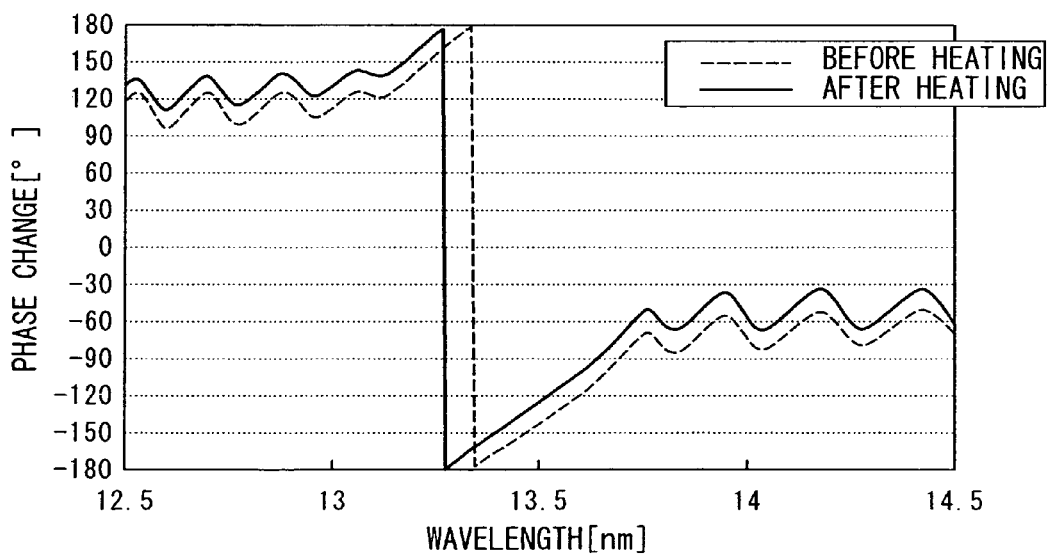
FIG. 5B shows relationships between heating processing and phase change with respect to a multilayer-film reflective mirror according to the first embodiment.

FIG. 5A shows the relationships between reflectance and the wavelength of an electromagnetic wave incident on the multilayer-film reflective mirror 10 (the multilayer film 4) respectively before and after being heated. FIG. 5B shows the relationships between phase change and the wavelength of an electromagnetic wave incident on the multilayer-film reflective mirror 10 respectively before and after being heated. The multilayer-film reflective mirror 10 before being heated is one such as the one shown in FIG. 2 and part (A) of FIG. 4. The multilayer-film reflective mirror 10 after being heated is one such as the one shown in FIG. 1 and part (B) of FIG. 4. FIGS. 5A and 5B show results of a simulation experiment when EUV light is incident on the multilayer-film reflective mirror 10 in predetermined conditions. The dashed line represents the result when an electromagnetic wave is incident on the multilayer-film reflective mirror 10, which has not been heated. The solid line represents the result when an electromagnetic wave is incident on the multilayer-film reflective mirror 10, which has been heated.

As a result of the simulation experiment, the multilayer-film reflective mirror 10 before being heated had: a peak wavelength of 13.50 nm at direct incidence; a reflectance at the peak wavelength (hereinafter referred to as peak reflectance) of 70.1%; a reflectance of 70.1% at an operation wavelength of 13.5 nm; and a phase change amount of −142° at an operation wavelength of 13.5 nm.

In the first region A1, the multilayer-film reflective mirror 10 after being heated had: a peak wavelength of 13.49 nm at direct incidence; a peak reflectance of 69.8%; a reflectance of 69.8% at an operation wavelength of 13.5 nm; and a phase change amount of −126° at an operation wavelength of 13.5 nm.

As described above, the reflectance at an operation wavelength of 13.5 nm before being heated is 70.1%, and the reflectance at an operation wavelength of 13.5 nm after being heated is 69.8%. Therefore, the reflectance changes only by −0.3% between before and after being heated. On the other hand, the phase change amount at the operation wavelength before being heated is −142°, and the phase change amount at the operation wavelength after being heated is −126°. Therefore, the phase changes by 16° before and after being heated. In this manner, by changing the multilayer film 4 in periodic length by a predetermined amount (here, 1%), a desired phase change can be obtained while maintaining a desired reflectance, when EUV light is incident on the multilayer-film reflective mirror 10.

As for a wavelength at an operation wavelength (13.5 nm), changing the phase by 360° is equivalent to, for example, cutting off the surface of the base 5 by half an amount (6.75 nm) of the operation wavelength. Changing the phase by 16° is equivalent to cutting off the surface of the base 5 by about 0.3 nm. Furthermore, when a surface of a multilayer film is machined to cut off a part of the surface in a conventional manner, changing the phase by 16° is equivalent to removing two layer pairs from the surface of the multilayer film. According to the present embodiment, by a simple method of heating the multilayer film 4, the phase can be accurately changed.

As described above, according to the present embodiment, the first region A1 that comprises the first layer group G1 at the first periodic length d1 and the second layer group G2 at the second periodic length d2 is provided in part of the multilayer film 4. Therefore, the multilayer-film reflective mirror 10 can offer a desired optical characteristic.

Furthermore, between the first layers 1 and second layers 2 of the second layer group G2, and the first layers 1 and second layers 2 of the third layer group G3, no steps or the like are present, and hence the layers are respectively continuous between the first region A1 and the second region A2. Therefore, between the respective regions within a layer surface of the multilayer film 4, the occurrence of a phenomenon such as a stepwise change in phase change amount can be suppressed.

Furthermore, by heating a part of the multilayer film 4, the multilayer-film reflective mirror 10 with a desired optical characteristic can be manufactured while suppressing increases in the machining workload. In the present embodiment, the multilayer film 4 is heated by irradiation of light onto the multilayer film 4. Therefore, any site (region) of the multilayer film 4 can be smoothly heated.

Furthermore, in the present embodiment, the heating conditions (light irradiation conditions) are adjusted so that the periodic length for a portion of five layer pairs from the surface in the first region A1 of the multilayer film 4 becomes equal to the second periodic length d2. For example, if the multilayer film 4 is heated so as to change all the fifty layer pairs in periodic length, the peak wavelength is significantly changed. As a result, there is a possibility that a desired optical characteristic is not obtained. By changing, in periodic length, one layer pair to ten layer pairs from the surface in the first region A1 of the multilayer film 4, a significant change in peak wavelength can be suppressed, and a desired optical characteristic can be obtained.

In the present embodiment, to heat the multilayer film 4, laser light is irradiated onto this multilayer film 4. However, an electron beam may be irradiated onto the multilayer film 4 to heat the multilayer film 4. Furthermore, the heating method is not limited to light irradiation. For example, a heater or the like may be used to heat the multilayer film 4.

Second Embodiment

Next is a description of a second embodiment. In the following description, components the same as or similar to those of the aforementioned embodiment are denoted by the same reference symbols, and descriptions thereof are simplified or omitted.

Figure 6:
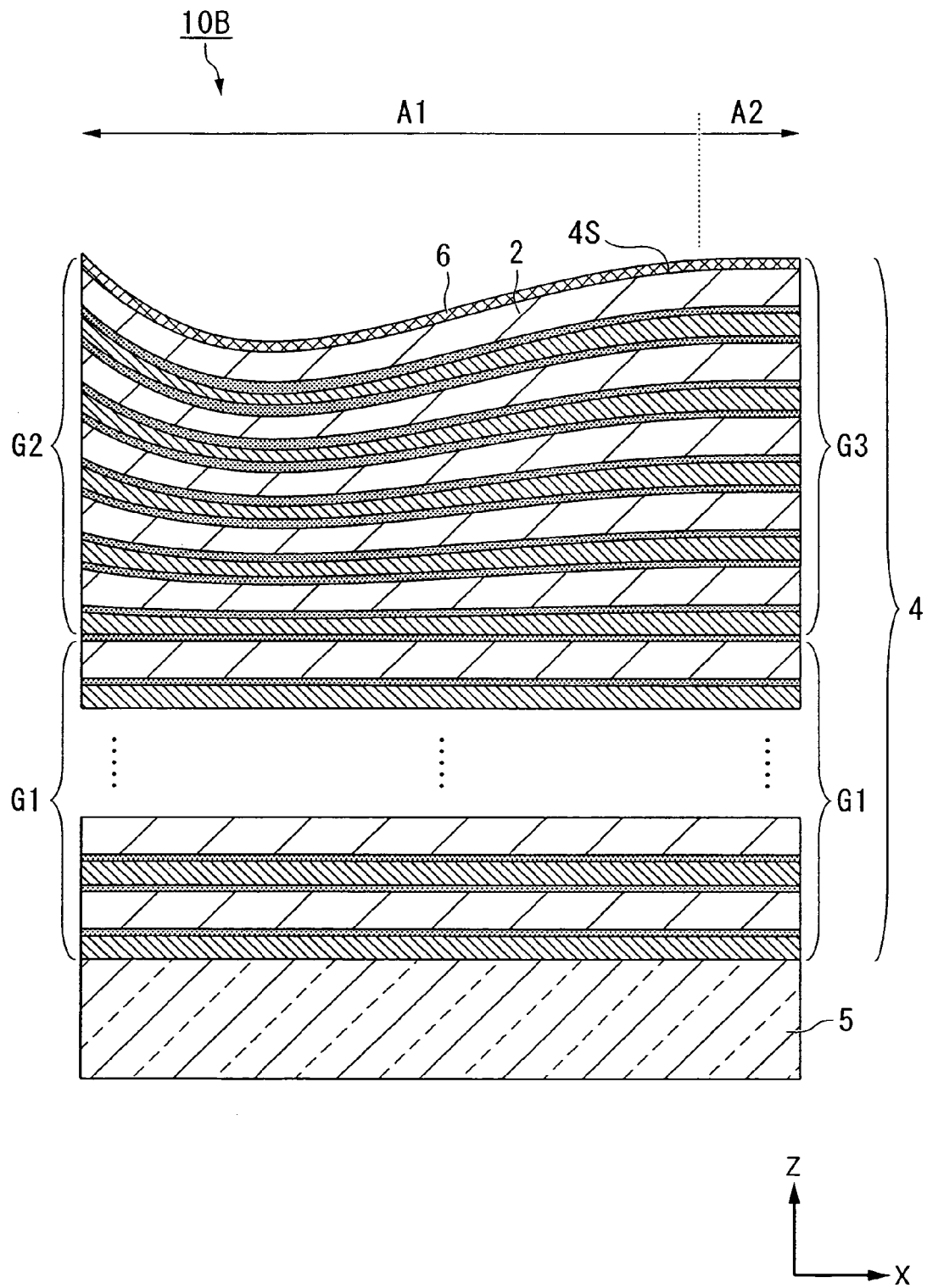
FIG. 6 is a schematic diagram showing one example of a multilayer-film reflective mirror according to a second embodiment.

FIG. 6 is a schematic diagram showing a multilayer-film reflective mirror 10B according to the second embodiment. In the present embodiment, the multilayer-film reflective mirror 10B comprises a protective layer 6 arranged so as to cover a surface 4S of a multilayer film 4.

Similarly to the above embodiment, the multilayer film 4 has: a first region A1 that comprises a first layer group G1 with a first periodic length d1 and a second layer group G2 with a second periodic length d2; and a second region A2 that comprises a first layer group G1 at the first periodic length d1 and a third layer group G3 at the same periodic length as the first periodic length d1. The surface 4S of the multilayer film 4 is formed of a second layer 2.

The protective layer 6 is arranged so as to cover the surface 4S of the multilayer film 4. In the present embodiment, the protective layer 6 is formed of ruthenium (Ru). As one example, in the present embodiment, the protective layer 6 has a thickness of 2 nm.

EUV light is absorbed in the air, resulting in attenuation. Therefore, in the case where a multilayer-film reflective mirror is used as an optical system of an EUV exposure apparatus, a predetermined space in which the multilayer-film reflective mirror is arranged is set in a vacuum state. However, it is difficult to bring the predetermined space into a complete vacuum state. There is a possibility that oxygen (and/or moisture) or the like is slightly present in the predetermined space. In the case where a surface of a multilayer-film reflective mirror is formed of a multilayer film without a protective layer, irradiation of EUV light onto the surface of the multilayer-film reflective mirror in a state with oxygen or the like being present in the predetermined space may oxidize the surface. A multilayer film (Mo/Si multilayer film) is readily oxidized. Therefore, in this case, there is a possibility of deterioration in the optical characteristics of the multilayer-film reflective mirror.

Furthermore, due to a failure to bring the predetermined space in which the multilayer-film reflective mirror is arranged into a perfect vacuum, an organic gas may be emitted into the predetermined space from for example a photosensitive material (photoresist) of a substrate to be exposed, an oil for use in a vacuum system for bringing the predetermined space into a vacuum state, and a lubricant for use in a various movable mechanisms. If the emitted organic gas is contacted with the surface of the multilayer-film reflective mirror, and EUV light is irradiated onto the surface in contact with the organic gas, a carbon-based material may be attached to the surface of the multilayer-film reflective mirror using a photochemical reaction. Attachment of a carbon-based material based on carbon is referred to as carbon contamination. Formation of carbon contamination on the surface of the multilayer-film reflective mirror deteriorates the optical characteristic of the multilayer-film reflective mirror. A conceivable way to remove carbon contamination is to perform a treatment of oxidizing the carbon contamination (for example, by using an ozone ashing treatment). However, in the case where a surface of a multilayer-film reflective mirror is formed of a multilayer film without a protective layer, the surface of the multilayer-film reflective mirror may be oxidized together with the carbon contamination, leading to the deterioration of the optical characteristic.

In the present embodiment, the protective layer 6 is arranged on the surface of the multilayer film 4. Consequently, the occurrence of the undesirable situation can be suppressed such as oxidation of the surface, attachment of carbon contamination to the multilayer film, and oxidation of a reflection surface due to a treatment of removing carbon contamination. Therefore, the deterioration of the surface of the multilayer film 4 can be suppressed.

Next is a description of a method of manufacturing the above multilayer-film reflective mirror 10B. First, similarly to the above first embodiment, the first layers 1 and the second layers 2 are alternately laminated on a base 5 to form a multilayer film 4 capable of reflecting EUV light. The multilayer film 4 that comprises the first layers 1, the second layers 2, and the diffusion layers 3 is formed by, for example, the sputtering method.

Figure 7:
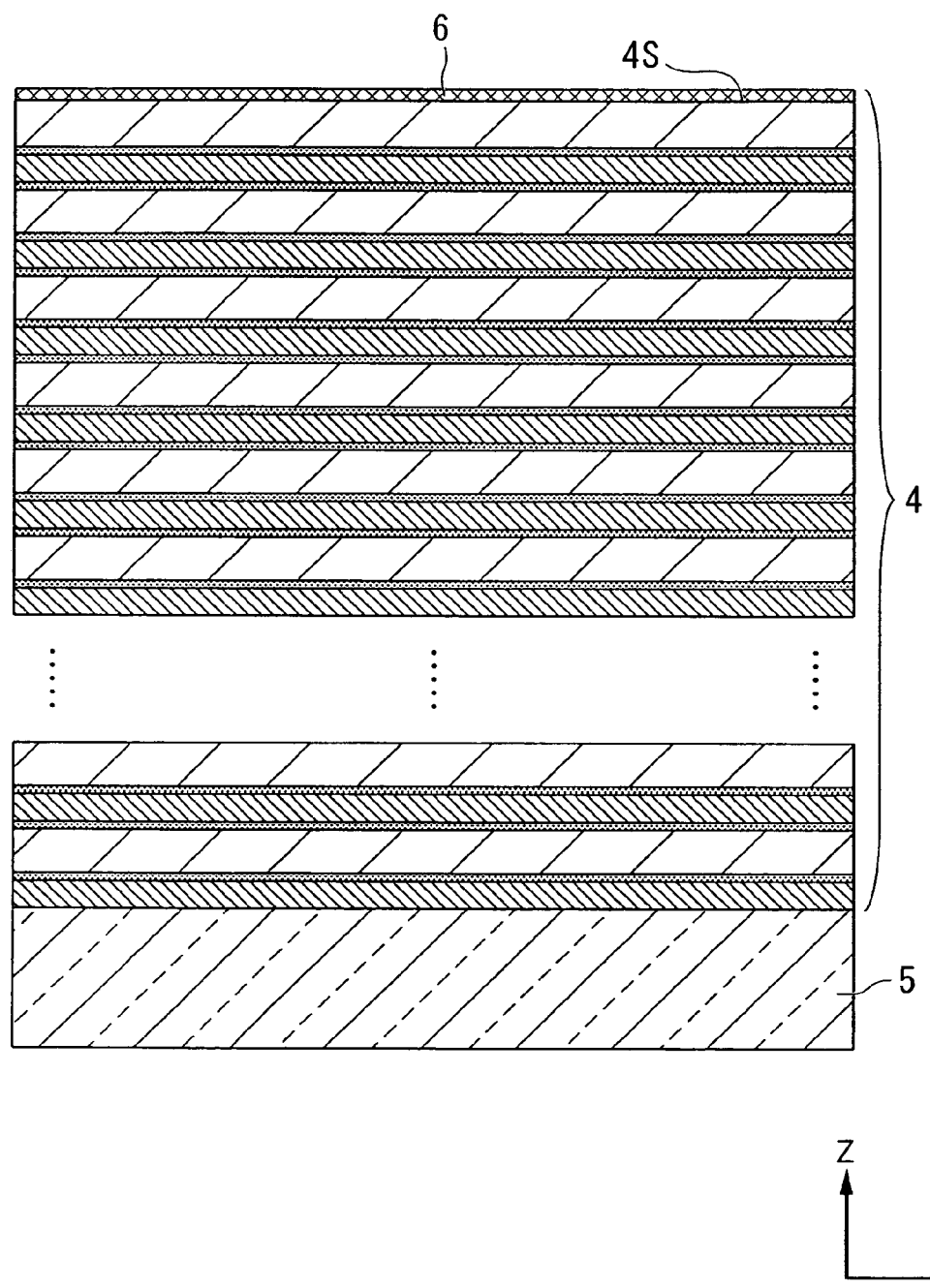
FIG. 7 is a schematic elevational section of a portion of a multilayer-film reflective mirror before commencing the selective heating method according to the second embodiment.
Figure 8:
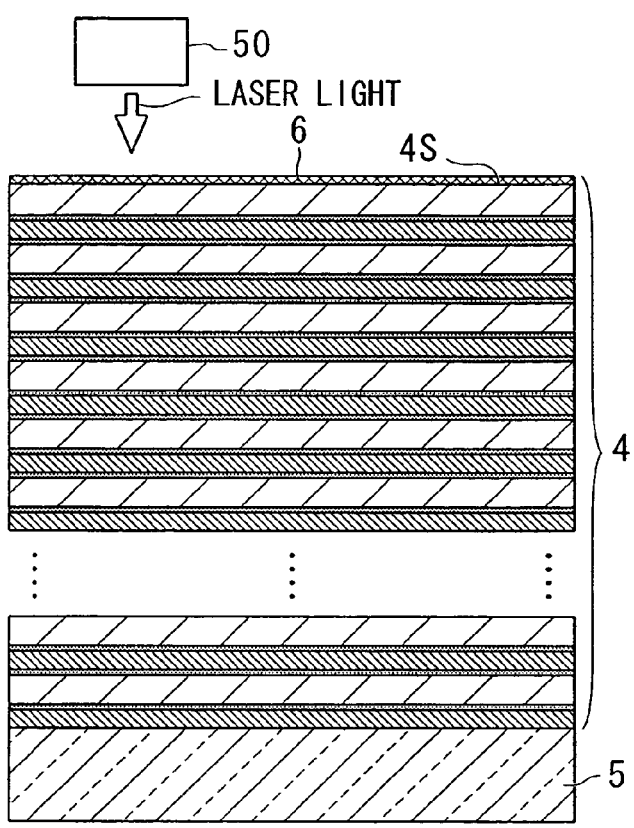
FIG. 8 is a schematic elevational section of a portion of a multilayer-film reflective mirror before (A) and after (B) heating using incident laser light, in the selective heating method according to the second embodiment.
Figure 8:
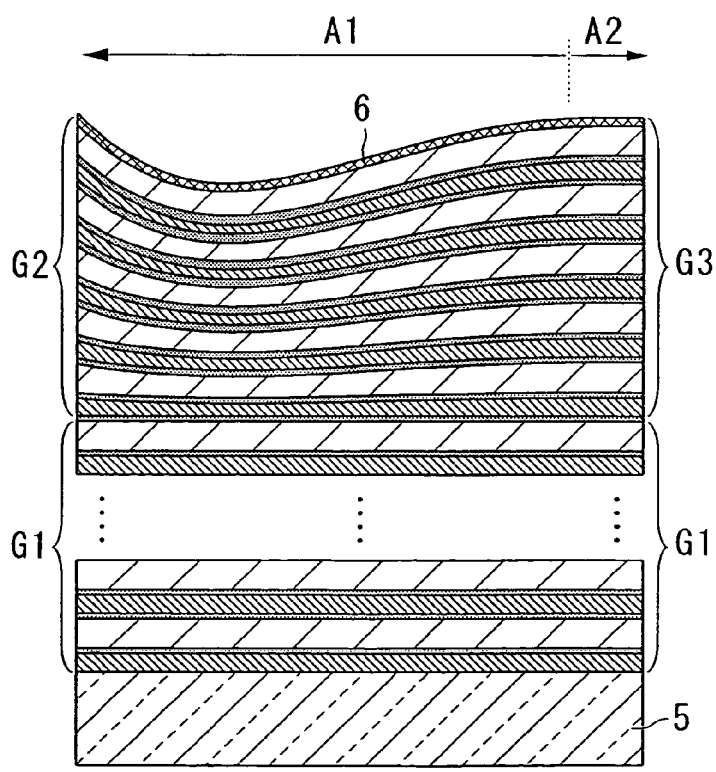

Next, as shown in FIG. 7, a protective layer 6 is formed so as to cover a surface 4S of the multilayer film 4. The protective layer 6 is formed by a predetermined deposition method such as the sputtering method comprising for example the ion beam sputtering method and the magnetron sputtering method. Note that the thickness, periodic length, and the like of the respective layers of the first layer 1, the second layer 2, and the diffusion layer 3 as shown in FIG. 7 and part (A) of FIG. 8 are similar to those as shown in FIG. 2.

Next, the processing of heating at least a part of the multilayer film 4 is performed. The processing of heating comprises the processing of irradiating light onto the surface of the multilayer film 4. As shown in part (A) of FIG. 8, in the present embodiment, to heat at least a part of the multilayer film 4, laser light from a laser apparatus 50 is irradiated onto the surface of the protective layer 6. At least a part of the multilayer film 4 is heated by the laser light. As a result, a part of the multilayer film 4 shrinks. In the multilayer film 4, there are formed a first region A1 that comprises a first layer group G1 with a first periodic length d1 and a second layer group G2 with a second periodic length d2, and a second region A2 that comprises a first layer group G1 at the first periodic length d1 and a third layer group G3 at the first periodic length d1, as shown in part (B) of FIG. 8. Note that the thickness, periodic length, and the like of the respective layers of the first layer 1, the second layer 2, and the diffusion layer 3, as shown in FIG. 6 and part (B) of FIG. 8, are similar to those as shown in FIG. 1.

Here, after the protective layer 6 is arranged so as to cover the surface 4S of the multilayer film 4, laser light is irradiated onto the protective layer 6 to heat the multilayer film 4, to thereby change the periodic lengths. However, after the formation of the multilayer film 4 on the base 5, and before the formation of the protective layer 6, laser light may be irradiated onto the multilayer film 4 to change the periodic lengths. After that, the protective layer 6 may be arranged so as to cover the surface of the multilayer film 4.

Figure 9A:
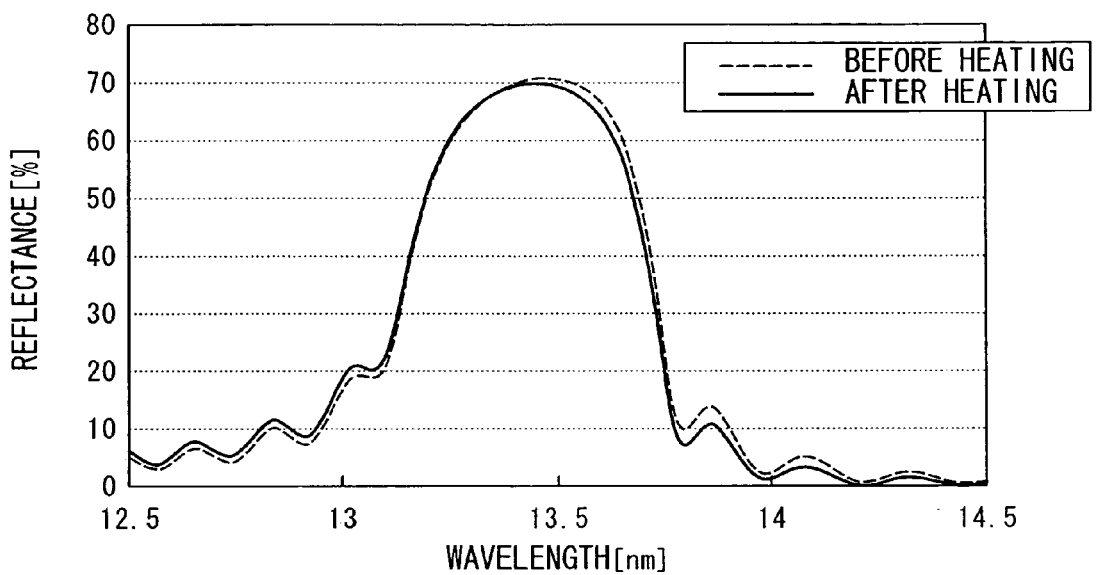
FIG. 9A shows relationships between heating processing and reflectance change with respect to a multilayer-film reflective mirror according to the second embodiment.
Figure 9B:
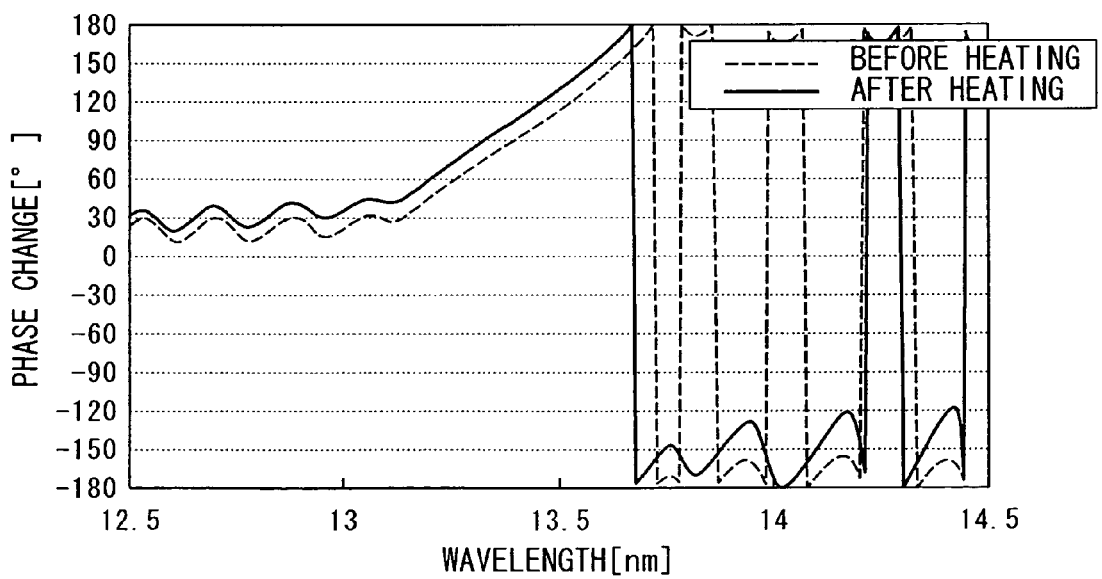
FIG. 9B shows relationships between heating processing and phase change with respect to a multilayer-film reflective mirror according to the second embodiment.

FIG. 9A shows the relationships between the reflectance and the wavelength of an electromagnetic wave incident on the multilayer-film reflective mirror 10B respectively before and after being heated. FIG. 9B shows the relationships between phase change and the wavelength of an electromagnetic wave incident on the multilayer-film reflective mirror 10B respectively before and after being heated. The multilayer-film reflective mirror 10B before being heated is one such as the one shown in FIG. 7 and part (A) of FIG. 8. The multilayer-film reflective mirror 10B after being heated is one such as the one shown in FIG. 6 and part (B) of FIG. 8. FIGS.

9A and 9B show the results of a simulation experiment when EUV light is incident on the multilayer-film reflective mirror 10B under predetermined conditions. The dashed line represents the result of an electromagnetic wave being incident on the multilayer-film reflective mirror 10B, which has not been heated. The solid line represents a result of when an electromagnetic wave is incident on the multilayer-film reflective mirror 10B, which has been heated.

As a result of the simulation experiment, the multilayer-film reflective mirror 10B before being heated had: a peak wavelength of 13.47 nm at direct incidence; a peak reflectance of 70.8%; a reflectance of 70.7% at an operation wavelength of 13.5 nm; and a phase change amount of +113° at an operation wavelength of 13.5 nm.

In the first region A1, the multilayer-film reflective mirror 10 after being heated had: a peak wavelength of 13.45 nm at direct incidence; a peak reflectance of 69.8%; a reflectance of 69.2% at an operation wavelength of 13.5 nm; and a phase change amount of +128° at an operation wavelength of 13.5 nm.

As described above, the reflectance at an operation wavelength of 13.5 nm before being heated is 70.7%, and the reflectance at an operation wavelength of 13.5 nm after being heated is 69.2%. Therefore, the reflectance changes only by −1.5% between before and after being heated. On the other hand, the phase change amount at the operation wavelength before being heated is +113°, and the phase change amount at the operation wavelength after being heated is +128°. Therefore, the phase changes by 15° before and after being heated. In this manner, even in the case where the protective layer 6 is provided, by changing the multilayer film 4 in periodic length by a predetermined amount, a desired phase change can be obtained while maintaining a desired reflectance, when EUV light is incident on the multilayer-film reflective mirror 10B.

In the present embodiment, the case where the protective layer 6 is formed of ruthenium (Ru) has been described as an example. More generally, for example, the protective layer can be formed of the material selected from a group comprising: ruthenium alloys, rhodium (Rh), rhodium alloys, niobium (Nb), niobium alloys, platinum (Pt), platinum alloys, molybdenum (Mo), molybdenum alloys, titanium dioxide ($TiO_2$), silicon dioxide ($SiO_2$), zirconium dioxide ($ZrO_2$), molybdenum disilicide ($MoSi_2$), silicon carbide (SiC), and inorganic oxides such as niobium oxide, and combinations thereof.

In the present embodiment, the sputtering method is used to form the protective layer 6. However, due to the materials forming the protective layer 6, not only the sputtering method but also other deposition methods, such as the vacuum deposition method and the CVD method, can be used to form the protective layer 6.

In the above first and second embodiments, the sputtering method is used to form the first layers 1 and the second layers 2. However, due to the materials forming the respective layers, not only the sputtering method but also other deposition methods such as the vacuum deposition method and the CVD method can be used to form the respective layers.

In the above first and second embodiments, an example has been described of the case where the surface of the base 5 and the surface 4S of the multilayer film 4 before being heated are planes substantially parallel to the XY plane. However, the surface of the base 5 and the surface of the multilayer film 4 may be convex surfaces protruded with respect to the multilayer film 4 side (the +Z side). Alternately, the surface of the base 5 and the surface of the multilayer film 4 may be concave surfaces recessed with respect to the multilayer film 4 side (the +Z side).

In the above first and second embodiments, an example has been described where the multilayer film 4 is a Mo/Si multilayer film. However, the material for forming the multilayer film 4 can be modified according to, for example, a wavelength band of EUV light. For example, in the case where EUV light in a wavelength band near 11.3 nm is used, a Mo/Be multilayer film in which molybdenum layers (Mo layers) and beryllium (Be layers) are alternately laminated can be used to obtain a high reflectance.

In the above first and second embodiments, ruthenium (Ru) can be used as a material for forming the first layer 1 of the multilayer film 4. Furthermore, as a material for forming the first layer 1 of the multilayer film 4, molybdenum (Mo) and ruthenium (Ru) may be combined. Furthermore, molybdenum carbide ($MO_2C$), molybdenum oxide ($MoO_2$), molybdenum silicide ($MoSi_2$), or the like may be used as a material for forming the first layer 1 of the multilayer film 4. As a material for forming the second layer 2 of the multilayer film 4, silicon carbide (SiC) can be used.

In the above first and second embodiments, for example between the base 5 and the multilayer film 4, there may be provided a metal layer with a high thermal conductivity formed of silver alloy, copper, copper alloy, aluminum, aluminum alloy, or the like. Alternately, between the base 5 and the multilayer film 4, there may be provided: a water-soluble foundation layer of lithium fluoride (LiF), magnesium fluoride ($MgF_2$), barium fluoride ($BaF_2$), aluminum fluoride ($AlF_3$), manganese fluoride ($MnF_2$), zinc fluoride ($ZnF_2$) or the like; or a foundation layer comprising a low melting alloy such as: one of binary to quinary eutectic alloys made of two or more types selected from the group consisting of eutectic alloy, Bi, Pb, In, Sn, and Cd; Au—Na eutectic alloy; Na—Tl eutectic alloy; and K—Pb eutectic alloy.

Third Embodiment

Next is a description of a third embodiment. In the following description, components the same as or similar to those of the aforementioned embodiments are denoted by the same reference symbols, and descriptions thereof are simplified or omitted.

Figure 10:
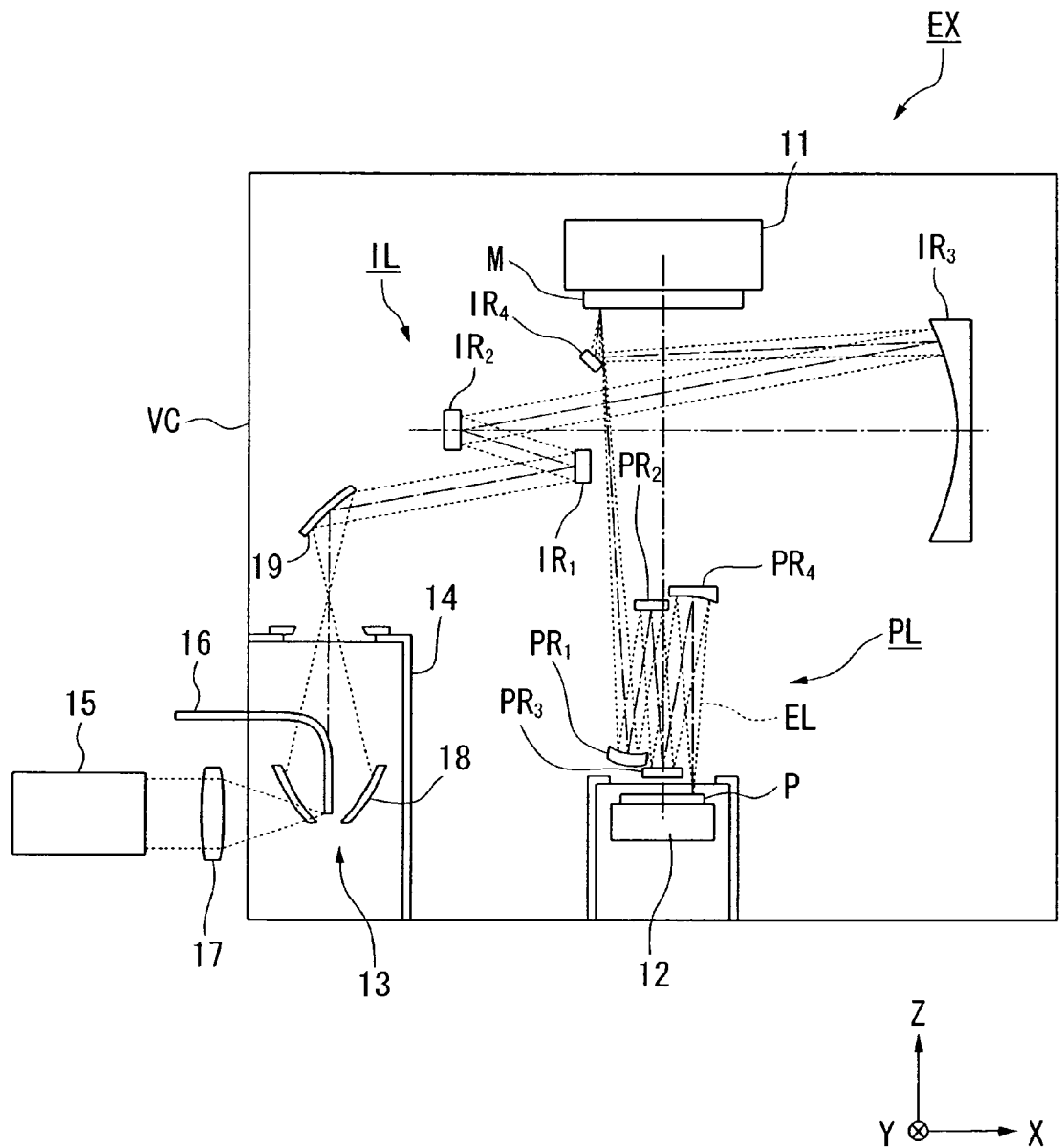
FIG. 10 is a schematic diagram showing one example of an exposure apparatus according to a third embodiment.

FIG. 10 is an exposure apparatus according to the third embodiment. The exposure apparatus EX in the present embodiment is an EUV exposure apparatus which uses EUV light as exposure light EL. The multilayer-film reflective mirror 10 (10B) described in the above first and second embodiments is used for an optical system of the EUV exposure apparatus EX according to the present embodiment.

In FIG. 10, the exposure apparatus EX comprises: a mask stage 11 capable of moving while holding a mask M; a substrate stage 12 capable of moving while holding a substrate P onto which exposure light EL is irradiated; an illumination optical system IL for illuminating the mask M held on the mask stage 11 with exposure light EL; a projection optical system PL for projecting an image of a pattern on the mask M illuminated by the exposure light EL onto the substrate P; and a chamber apparatus VC that forms a predetermined space through which at least the exposure light EL passes and that has a vacuum system for rendering the predetermined space to a vacuum state (for example, $1.3 \times 10^{-3}$ Pa or below).

The illumination optical system IL comprises a plurality of optical elements $IR_1$ to $IR_4$. It illuminates the mask M with the exposure light EL from a light source 13. The light source 13 in this embodiment is a laser-excited plasma light source. It comprises: a housing 14; a laser apparatus 15 for emitting laser light; and a supply member 16 for supplying a target material such as a xenon gas into the housing 14. Laser light emitted from the laser apparatus 15 and collected by a collection optical system 17 is irradiated onto the target material injected from a front end of the supply member 16. The target material irradiated with the laser light is turned into a plasma, to thereby generate EUV light. The EUV light generated at the front end of the supply member 16 is collected by a condenser 18. The EUV light via the condenser 18 is incident on a collimator mirror 19 arranged outside the housing 14. Note that the light source 13 may be a plasma discharge apparatus.

The illumination optical system IL has the plurality of optical elements $IR_1$ to $IR_4$. It uniformly illuminates an illumination region on the mask M. The exposure light (EUV light) that is illuminated by the illumination optical system IL and reflected off the mask M is incident in the projection optical system PL.

The projection optical system PL has a plurality of optical elements $PR_1$ to $PR_4$. An image of a pattern on the mask M which is illuminated with the exposure light EL is projected via the projection optical system PL onto a substrate P on which is formed a film of a photosensitive material (photoresist).

In the present embodiment, the multilayer-film reflective mirror described in the first to fourth embodiments is used for at least one of the plurality of optical elements $IR_1$ to $IR_4$ of the illumination optical system IL and the plurality of optical elements $PR_1$ to $PR_4$ of the projection optical system PL. As a result, optical characteristics of the illumination optical system IL and the projection optical system PL are maintained. Therefore, the substrate P can be favorably exposed.

Note that as for the substrate P of each of the above embodiments, not only a semiconductor wafer for manufacturing a semiconductor device, but also a glass substrate for a display device, a ceramic wafer for a thin film magnetic head, or a master mask or reticle (synthetic quartz or silicon wafer) for use in an exposure apparatus, etc. can be used.

As for the exposure apparatus EX, in addition to a scan type exposure apparatus (scanning stepper) in which while synchronously moving the mask M and the substrate P, the pattern of the mask M is scan-exposed, a step-and-repeat type projection exposure apparatus (stepper) in which the pattern of the mask M is exposed at one time in the condition that the mask M and the substrate P are stationary, and the substrate P is successively moved stepwise can be used.

Furthermore, in step-and-repeat type exposure, after a reduced image of a first pattern is transferred onto the substrate P by using the projection optical system, in the state with the first pattern and the substrate P being substantially stationary, a reduced image of a second pattern may be exposed in a batch onto the substrate P, partially overlapped on the first pattern by using the projection optical system, in the state with the second pattern and the substrate P being substantially stationary (a stitch type batch exposure apparatus). Moreover, as the stitch type exposure apparatus, a step-and-stitch type exposure apparatus in which at least two patterns are transferred onto the substrate P in a partially overlapping manner, and the substrate P is sequentially moved can be used.

Moreover, the present invention can also be applied to an exposure apparatus as disclosed for example in U.S. Pat. No. 6,611,316, which combines patterns of two masks on a substrate via a projection optical system, and double exposes a single shot region on the substrate at substantially the same time, using a single scan exposure light.

Furthermore, the present invention can also be applied to a twin stage type exposure apparatus furnished with a plurality of substrate stages, as disclosed in U.S. Pat. No. 6,341,007, U.S. Pat. No. 6,400,441, U.S. Pat. No. 6,549,269, U.S. Pat. No. 6,590,634, U.S. Pat. No. 6,208,407, U.S. Pat. No. 6,262,796, etc.

Moreover, the present invention can also be applied to an exposure apparatus furnished with a substrate stage for holding a substrate, and a measurement stage on which is mounted a reference member formed with a reference mark, and/or various photoelectronic sensors, as disclosed for example in U.S. Pat. No. 6,897,963. Furthermore, the present invention can also be applied to an exposure apparatus furnished with a plurality of substrate stages and measurement stages.

The types of exposure apparatuses EX are not limited to exposure apparatuses for semiconductor element manufacture that expose a semiconductor element pattern onto a substrate P, but are also widely applicable to exposure apparatuses for the manufacture of liquid crystal display elements and for the manufacture of displays, and exposure apparatuses for the manufacture of thin film magnetic heads, image pickup devices (CCDs), micro machines, MEMS, DNA chips, and reticles or masks.

As far as is permitted by the law, the disclosures in all of the Publications and U.S. patents related to exposure apparatuses and the like cited in the above respective embodiments and modified examples, are incorporated herein by reference.

As described above, the exposure apparatus EX of the foregoing embodiments is manufactured by assembling various subsystems, comprising the respective constituent elements, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus comprises mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Note that it is preferable that the manufacture of the exposure apparatus be performed in a clean room in which the temperature, the degree of cleanliness, etc. are controlled.

Figure 11:
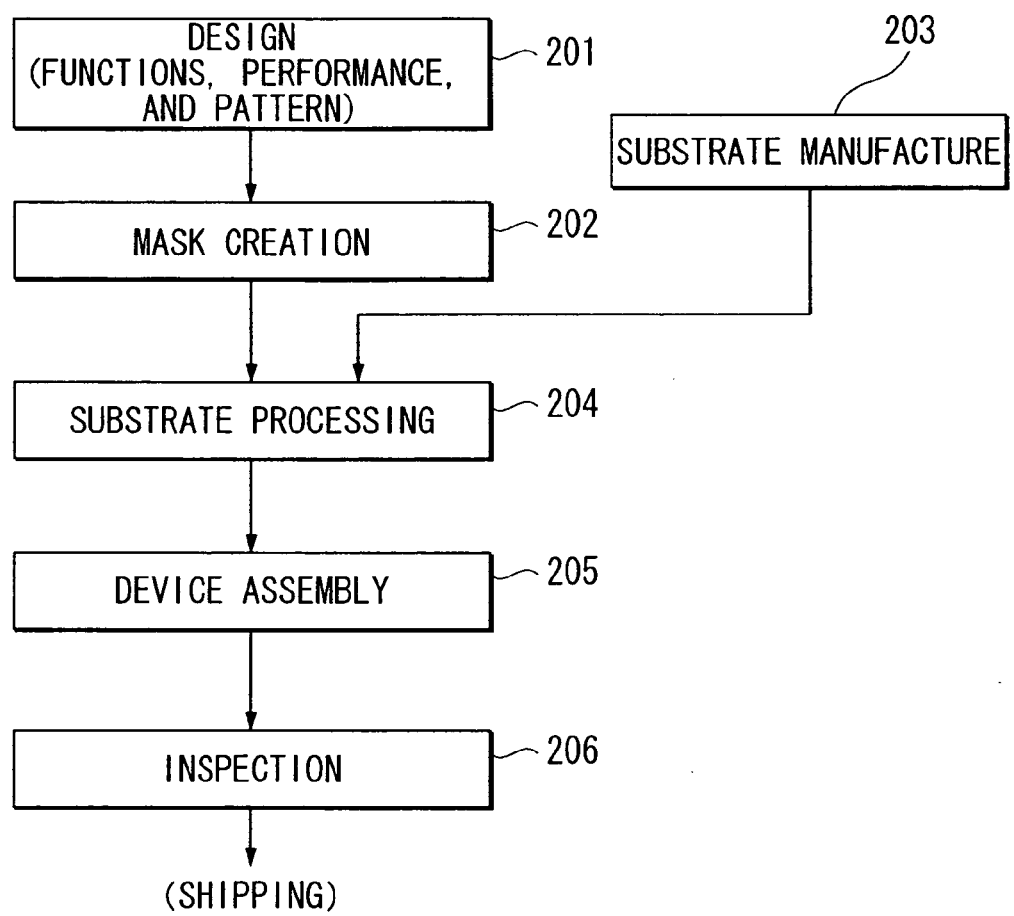
FIG. 11 is a flow chart for explaining one example of manufacturing steps for a micro device.

As shown in FIG. 11, microdevices such as semiconductor devices are manufactured by going through: a step 201 that performs microdevice function and performance design, a step 202 that creates the mask (reticle) based on this design step, a step 203 that manufactures the substrate that is the device base, a substrate processing step 204 comprising substrate processing (exposure processing) that exposes an image of the pattern on the mask onto a substrate according to the aforementioned embodiments and develops the exposed substrate, a device assembly step (comprising treatment processes such as a dicing process, a bonding process and a packaging process) 205, and an inspection step 206, and so on.

What is claimed is:
1. A multilayer-film reflective mirror, comprising:
a base; and
a multilayer film formed on the base, the multilayer film comprising multiple layer pairs, each layer pair comprising a respective first layer and a respective second layer, the first and second layers being laminated together in an alternating manner;

first and second regions of the multilayer film that reflect extreme ultraviolet light;

a first group of layer pairs disposed in each of the first and second regions and having a first periodic length;

a second group of layer pairs disposed over the first group in the first region, the second group having a second periodic length less than the first periodic length; and a third group of layer pairs disposed over the first group in the second region, the third group having a periodic length substantially equal to the first periodic length, wherein the first and second regions have similar reflectance, within a specified tolerance level, to an operational wavelength of incident light as the first region produces reflected light exhibiting a respective phase change with respect to the incident light having the operational wavelength, compared to the second region, wherein the first and second regions collectively define a mirror surface that exhibits smooth and continuous transitions in surface shape from first regions to second regions and from second regions to first regions, and wherein phase-changes in boundaries defined by first and second regions are smoothly and continuously distributed.

2. The multilayer-film reflective mirror according to claim 1, wherein the first and second layers of the second group are respectively continuous with the first and second layers of the third group between the first region and the second region.

3. The multilayer-film reflective mirror according to claim 1, wherein, in the second region, the first and second layers of the first group and the first and second layers of the third group are successive.

4. The multilayer-film reflective mirror according to claim 1, wherein the second group in the first region has an equal number of layers as the third group in the second region.

5. The multilayer-film reflective mirror according to claim 1, wherein the first group in the first region has an equal number of layers as the first group in the second region.

6. The multilayer-film reflective mirror according to claim 1, wherein, in the first region, the first and second layers of the first group and the first and second layers of the second group are successive.

7. The multilayer-film reflective mirror according to claim 1, further comprising a respective diffusion layer between each first layer and each second layer, each diffusion layer being of material diffused thereto from the first layer and from the second layer, wherein, in the first region, each diffusion layer of the second group is thicker than the corresponding diffusion layer of the first group.

8. The multilayer-film reflective mirror according to claim 7, wherein the second periodic length is shorter than the first periodic length.

9. The multilayer-film reflective mirror according to claim 7, wherein, in the first region the second group comprises one to ten layer pairs.

10. The multilayer-film reflective mirror according to claim 1, wherein a difference between a refractive index of the first layer to extreme ultraviolet light and a refractive index of a vacuum is larger than that of the second layer.

11. The multilayer-film reflective mirror according to claim 1, wherein each first layer comprises at least one of molybdenum and ruthenium.

12. The multilayer-film reflective mirror according to claim 1, wherein each second layer comprises silicon.

13. The multilayer-film reflective mirror according to claim 1, further comprising a protective layer arranged so as to cover a surface of the multilayer film.

14. The multilayer-film reflective mirror according to claim 13, wherein the protective layer comprises a material selected from a group comprising ruthenium, ruthenium alloys, rhodium, rhodium alloys, niobium, niobium alloys, platinum, platinum alloys, molybdenum, molybdenum alloys, titanium dioxide, silicon dioxide, zirconium dioxide, molybdenum disilicide, silicon carbide, and combinations thereof.

15. An exposure apparatus that exposes a substrate with exposure light, comprising the multilayer-film reflective mirror according to claim 1.

16. A device manufacturing method, comprising:
exposing a substrate by use of the exposure apparatus according to claim 15; and
developing the exposed substrate.

17. The multilayer-film reflective mirror of claim 1, further comprising a gradual boundary between the first and second regions on the surface of the multilayer film.

18. The multilayer-film reflective mirror according to claim 1, wherein the second group has fewer layer pairs than the first group in the first region.

19. The multilayer-film reflective mirror according to claim 1, wherein:
the first and second regions collectively produce a wavefront of reflected light; the first region, as a result of it producing reflected light exhibiting a respective phase change with respect to the incident light having the operational wavelength, produces a respective correction to the wavefront.

* * * * *